United States Patent
Kuroyanagi et al.

(10) Patent No.: US 6,933,618 B2
(45) Date of Patent: Aug. 23, 2005

(54) TABLET COMPRISING EPOXY RESIN COMPOSITION

(75) Inventors: Akihisa Kuroyanagi, Ibaraki (JP); Hisataka Ito, Ibaraki (JP); Shinichirou Sudo, Ibaraki (JP); Hirofumi Oono, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 10/843,339

(22) Filed: May 12, 2004

(65) Prior Publication Data

US 2004/0210008 A1 Oct. 21, 2004

Related U.S. Application Data

(62) Division of application No. 10/662,451, filed on Sep. 16, 2003, now Pat. No. 6,852,263, which is a division of application No. 09/819,710, filed on Mar. 29, 2001, now Pat. No. 6,646,063.

(30) Foreign Application Priority Data

Mar. 29, 2000 (JP) .......................................... 2000-92028
Mar. 29, 2000 (JP) .......................................... 2000-92029
Mar. 29, 2000 (JP) .......................................... 2000-92030

(51) Int. Cl.⁷ ........................... H01L 23/28; C08L 61/08
(52) U.S. Cl. ....................... 257/793; 257/702; 525/466; 525/481; 525/788
(58) Field of Search .............................. 257/687, 702, 257/793; 525/466, 481, 788, 793

(56) References Cited

U.S. PATENT DOCUMENTS

| 4,293,519 | A | 10/1981 | Knappenberger et al. |
| 4,554,126 | A | 11/1985 | Sera |
| 5,641,996 | A | 6/1997 | Omoya et al. |
| 5,645,787 | A | 7/1997 | Taruno et al. |
| 5,698,152 | A | 12/1997 | Taruno et al. |
| 5,703,406 | A | 12/1997 | Kang |
| 5,731,370 | A | 3/1998 | Shiobara et al. |
| 5,990,546 | A | 11/1999 | Igarashi et al. |
| 6,083,774 | A | 7/2000 | Shiobara et al. |
| 6,288,169 | B1 | 9/2001 | Usui et al. |
| 6,646,063 | B2 * | 11/2003 | Kuroyanagi et al. ........ 525/481 |

FOREIGN PATENT DOCUMENTS

| JP | 0 3 124758 A2 | 5/1991 |
| JP | 0 6 104301 | 4/1994 |
| JP | 0 8 340014 | 12/1996 |
| JP | 0 9 036149 | 2/1997 |

* cited by examiner

*Primary Examiner*—Ngân V. Ngô
(74) *Attorney, Agent, or Firm*—Birch, Stewart, Kolasch & Birch, LLP

(57) ABSTRACT

A tablet for producing a semiconductor device with substantially no bowing, comprising an epoxy resin composition comprising an epoxy resin and a curing agent, wherein the tablet has the characteristic of an amount reduced by heating being less than 0.05% by weight; a wafer with a resin layer and a semiconductor device produced by using the tablet; and a process for producing the wafer and the semiconductor device.

2 Claims, 5 Drawing Sheets

TABLET COMPRISING EPOXY RESIN COMPOSITION

This application is a divisional of application No. 10/662,451, filed on Sep. 16, 2003 now U.S. Pat. No. 6,852,263, which in turn is a divisional of application No. 09/819,710, filed on Mar. 29, 2001, now U.S. Pat. No. 6,646,063 B2. The entire contents of both of these applications are hereby incorporated by reference. Priority is claimed under 35 U.S.C. §120 to applications Nos. 10/662,451 and 09/819,170. This application also claims priority under 35 U.S.C. §119 to applications Nos. 2000-92028, 2000-02029, and 2000-92030, filed in Japan on Mar. 29, 2000.

BACKGROUND OF THE INVENTION

1. Field of the Invention

The present invention relates to a tablet for producing a one-sided sealing-type semiconductor device, comprising an epoxy resin composition with suppression in the generation of bowing and high reliability, a wafer with a resin layer and a semiconductor device produced by using the tablet.

2. Discussion of the Related Art

Conventionally, a cured resin layer is formed on one side of a wafer comprising a plural projected electrodes by subjecting a tablet comprising an epoxy resin composition to hot press molding, wherein the epoxy resin composition is obtained by cold pressing molding. However, in the wafer with a resin layer in which a cured resin layer is formed by using the tablet described above, there arises a problem that bowing is generated. Specifically, when a cured resin layer is formed by using the above-mentioned tablet, the bowing of the wafer with a resin layer is undesirably caused because the physical properties such as a coefficient of linear expansion of a cured product of an epoxy resin composition, which is the cured resin layer, are different from those of a wafer. The wafer with a resin layer in which the bowing described above is generated causes troubles during conveying and dicing, and has a defect that its applicability to the substrate becomes poor. Further, there also arise some problems that a stress is generated at the interface of the wafer and the cured resin layer, so that its reliability is impaired.

In addition, in the technique of packaging (sealing) a semiconductor element in the field of semiconductor devices in the recent years, one-sided sealing-type semiconductor devices, for instance, have been remarked and actually used. A semiconductor device in which a semiconductor element is sealed by a cured product of an epoxy resin composition has excellent mass-producibility and low costs. Further, the above-mentioned one-sided sealing type semiconductor device can have high performance by highly integrating the semiconductor element. In addition, in a method of mounting a semiconductor element to a board, which is the insulating substrate mentioned above in a flip chip manner or a direct chip attachment manner, sealing is usually carried out by one-sided sealing in a state of incorporating the semiconductor element, or alternatively by filling a molten thermosetting resin composition in a void between the insulating substrate and the semiconductor device and curing the composition. However, these semiconductor devices have some problems of generation of bowing of the package caused by curing shrinkage of a sealing resin, and incongruence in the coefficients of linear expansion of the insulating substrate and the sealing resin (cured product). In the semiconductor device in which the bowing described above is generated, peeling or the like is caused at the sealing interface by the stress due to bowing, so that its reliability is lowered, thereby resulting in poor applicability to a substrate. Therefore, a solution to such a problem is desired.

An object of the present invention to provide a tablet comprising an epoxy resin composition for producing a one-sided sealing-type semiconductor device with suppression in the generation of bowing and high reliability.

Another object of the present invention is to provide a wafer and a semiconductor device produced by using a tablet comprising an epoxy resin composition, and processes for producing the tablet: and the wafer.

Still another object of the present invention is to provide a method of preventing generation of bowing of the wafer and the semiconductor device.

Still another object of the present invention is to provide a use of a tablet comprising an epoxy resin composition for preventing generation of bowing of the wafer and the semiconductor device.

These and other objects of the present invention will be apparent from the following description,

SUMMARY OF THE INVENTION

The present inventors have again studied on causation of bowing of the wafer with a resin layer from various angles. As a result, they have found that an amount reduced by heating of the tablet before molding is one of causations of bowing as well as conventionally known causations of curing shrinkage of the cured resin layer and incongruence in coefficients of linear expansion of the wafer and the cured resin layer. It is thought that the shrinkage of the resin is caused by exhalation of volatile components remaining in the internal of the cured resin layer when pressure-releasing.

The same can be said for the causations of bowing of the package. As a result of further studies based on these findings, in order to suppress the generation of the above-mentioned bowing, the present inventors have found that it is effective to reduce volatile components in the tablet usable for formation of the cured resin layer of a wafer with a resin layer, or the volatile components in the tablet before curing usable for sealing a semiconductor element on the insulating substrate, and to diminish the amount reduced by heating the tablet. Therefore, the present inventors have found that by Using a tablet having an amount reduced by heating lower than a specified amount of the volatile components, the shrinkage of the resin due to exhalation when pressure-releasing can be suppressed, whereby the generation of bowing can be consequently suppressed. Also, the semiconductor device obtained by using the above-mentioned tablet of course has high reliability with suppression in the generation of bowing.

In addition, the present inventors have found that by using as the tablet one obtained by preparing a molten product comprising an epoxy resin composition and cooling and solidifying the molten product, the compression ratio of the tablet is made large and the resin of the tablet is made very dense, so that the tablet is less likely to be hygroscopic, whereby a tablet having a small amount reduced by heating can be obtained. Therefore, they have found that when a tablet of which compression ratio is very high and cured product has a glass transition temperature of not less than a particular value is used, a semiconductor device with more effective suppression of the generation of bowing and high reliability can be obtained. Further, they have found that a semiconductor device having high reliability can be obtained because the voids in the molded product can be reduced by having a low volatile component content and a high compression ratio. The present invention has been accomplished based on these findings.

Concretely, the present invention pertains to the following:

(1) a tablet for producing a semiconductor device with substantially no bowing, comprising an epoxy resin composition comprising an epoxy resin and a curing agent, wherein the tablet has the following characteristic (A):
   (A): an amount reduced by heating being less than 0.05% by weight;
(2) the tablet according to item (1) above, obtainable by a process comprising preparing a molten product of the epoxy resin composition in an uncured state, and thereafter cooling and solidifying the molten product;
(3) the tablet according to item (1) or (2) above, further having at least one characteristic selected from the group consisting of:
   (B): a compression ratio of the tablet being 98% or more; and
   (C): a glass transition temperature of a cured product of the tablet being 120° C. or more;
(4) a wafer with a resin layer comprising a plural projected electrodes and a cured resin layer formed on a projected electrode-mounting side of the wafer, wherein the cured resin layer is formed by the tablet of any one of items (1) to (3) above;
(5) a semiconductor device obtainable by a process comprising dicing the wafer with a resin layer of item (4) above into a given size;
(6) a semiconductor device comprising an insulating substrate, a semiconductor element mounted on one side of the insulating substrate, and a cured product of an epoxy resin composition, the semiconductor element being incorporated in and sealed by the cured product, wherein the cured product of an epoxy resin composition is formed by the tablet of any one of items (1) to (3) above;
(7) a semiconductor device comprising an insulating substrate, a semiconductor element mounted on one side of the insulating substrate via a plural connecting electrodes, and a cured resin layer sealing a void between the insulating substrate and the semiconductor element, wherein the cured resin layer is formed by the tablet of any one of items (1) to (3) above;
(8) a process for producing a wafer with a resin layer comprising a plural projected electrodes and a cured resin layer formed on a projected electrode-mounting side of the wafer, comprising the steps of putting the tablet of any one of items (1) to (3) above on the projected electrode-mounting side of the wafer, and heating the tablet to be melt-cured, thereby forming the cured resin layer;
(9) a process for producing a semiconductor device comprising an insulating substrate, a semiconductor element mounted on one side of the insulating substrate, and a cured product of an epoxy resin composition, the semiconductor element being incorporated in and sealed by the cured product, comprising the steps of putting the tablet of any one of items (1) to (3) above on the semiconductor element, and heating the tablet to be melt-cured, thereby forming the cured product;
(10) a process for producing a semiconductor device comprising an insulating substrate, a semiconductor element mounted on one side of the insulating substrate via a plural connecting electrodes, and a cured resin layer sealing a void between the insulating substrate and the semiconductor element, comprising the steps of heat-melting the tablet of any one of items (1) to (3) above, and filling the void and curing the tablet, thereby forming the cured resin layer;
(11) a method for preventing generation of bowing of a wafer, comprising forming a cured resin layer on a wafer by using the tablet of any one of items (1) to (3) above;
(12) a method for preventing generation of bowing of a semiconductor device, comprising sealing semiconductor elements on one side of an insulating substrate by using the tablet of any one of items (1) to (3) above;
(13) use of a tablet of any one of items (1) to (3) above for preventing generation of bowing of a wafer in the production of the wafer in which a cured resin layer is formed on the wafer; and
(14) use of a tablet of any one of items (1) to (3) above for preventing generation of bowing of a semiconductor device in the production of the semiconductor device in which semiconductor elements are sealed on one side of an insulating substrate.

DETAILED DESCRIPTION OF THE INVENTION

Figure 1:
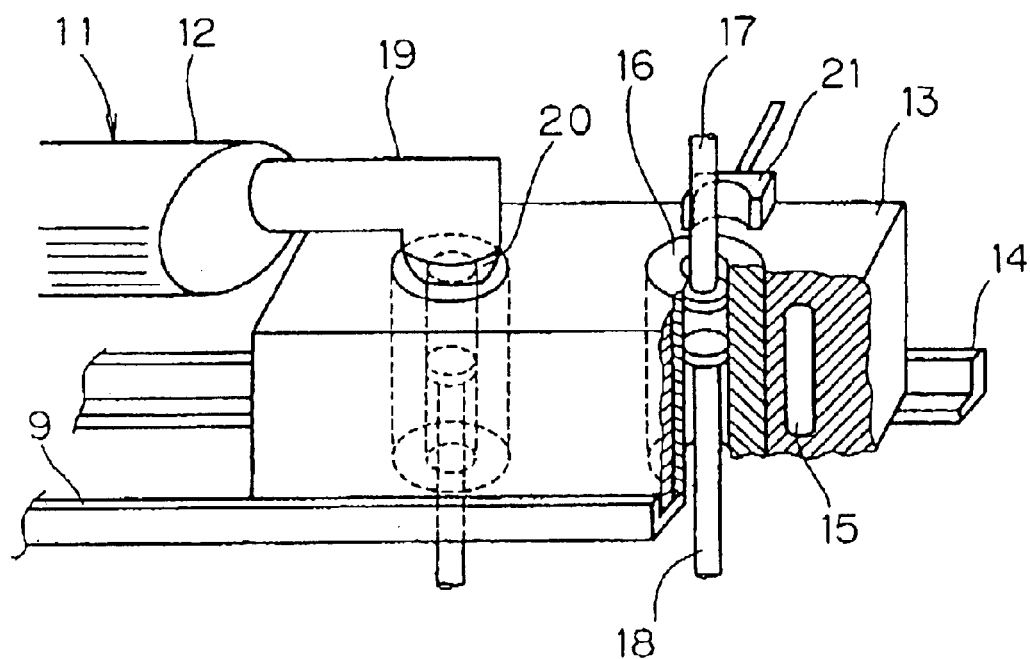
FIG. 1 is an explanatory view showing one example of a production apparatus for producing a tablet comprising an epoxy resin composition.

The tablet comprising an epoxy resin composition [hereinafter simply referred to as "tablet"] of the present invention has the following characteristic (A):

(A): an amount reduced by heating being less than 0.05% by weight.

The epoxy resin composition usable for the preparation of the tablet comprises an epoxy resin and a curing agent.

The above-mentioned epoxy resin is not particularly limited, and conventionally known various epoxy resins, for instance, cresol novolak epoxy resins, phenol novolak epoxy resins, bisphenol A epoxy resins, naphthalene epoxy resins, biphenyl epoxy resins, and the like can be used. Among the various epoxy resins, it is preferable that the epoxy resin represented by the following general formula (1):

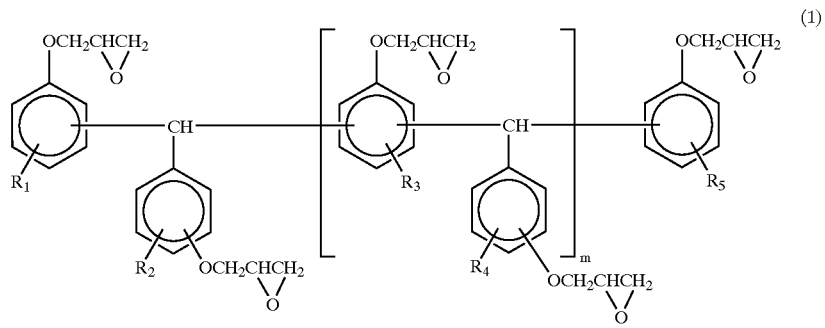

wherein each of $R_1$ to $R_5$, which may be identical or different, is hydrogen atom or an alkyl group having 1 to 5 carbon atoms; and m is 0 or a positive number of 5 or less, is used as all or a part of the epoxy resin component, from the viewpoint of reducing the bowing by improvement in the glass transition temperature.

A preferable curing agent which is usable together with the above-mentioned epoxy resin includes a phenolic resin. The curing agent is not particularly limited thereto, and any of conventionally known ones can be used. The curing agent includes, for instance, phenol novolak, cresol novolak, bisphenol A novolak, naphthol novolak, triphenylmethane type phenolic resins, phenol aralkyl resins, and the like.

It is preferable that the formulation ratio of the above-mentioned epoxy resin to the above-mentioned phenolic resin is adjusted such that hydroxyl groups in the phenolic resin is from 0.7 to 1.3 equivalents, and especially from 0.9 to 1.1 equivalents per one equivalent of the epoxy group in the above-mentioned epoxy resin.

It is preferable to further use an inorganic filler together with the above-mentioned epoxy resin and the phenolic resin. The inorganic filler includes those in pulverized, ground, or spherical forms, and conventionally known various fillers can be used without particular limitation. The inorganic filler includes, for instance, silica powders such as silica glass powder, talc, fused silica powder and crystalline silica powder; alumina; silicon nitride; aluminum nitride; silicon carbide; and the like. These inorganic fillers can be used alone or in admixture of two or more kinds. It is preferable to use the fused silica powder, from the viewpoint of fluidity, especially spherical fused silica powder. As the above-mentioned inorganic filler, it is preferable that the average particle size is in the range of from 0.1 to 50 μm as determined by laser particle size analyzer, more preferably from 0.1 to 30 μm, still more preferably 0.5 to 10 μm.

It is preferable that the content of the above-mentioned inorganic filler is adjusted to make up 60 to 95% by weight of the epoxy resin composition.

In the above-mentioned epoxy resin composition, besides the above-mentioned epoxy resin, the phenolic resin and the inorganic filler, there can be optionally properly added a curing accelerator, a pigment, a mold-releasing agent, a flexibility imparting agent, a coupling agent such as a silane coupling agent such as silane coupling agents containing epoxy group, amino group, mercapto group, vinyl group or methacryl group, such as γ-glycidoxypropyl trimethoxysilane; an ion trapping agent, a flame retarder, a tackifying agent, and the like.

The above-mentioned curing accelerator is not particularly limited, as long as the curing accelerator acts to accelerate the reaction between epoxy group and hydroxyl group. The curing accelerator includes, for instance, diazabicycloalkene compounds such as 1,8-diazabicyclo[5.4.0]undecene-7,1,5-diazabicyclo[4.3.0]nonene-5; tertiary amines such as triethylenediamine; imidazoles such as 2-methylimidazole; phosphorus-containing compounds such as triphenylphosphine; and the like. These compounds can be used alone or in admixture of two or more compounds.

The above-mentioned pigment includes carbon blacks, titanium oxide, and the like. Also, the above-mentioned mold-releasing agent includes carnauba wax, polyethylene waxes, paraffins, esters of fatty acids, salts of fatty acids, and the like.

The above-mentioned flexibility imparting agent includes various silicone compounds, acrylonitrile-butadiene rubber, and the like.

The above-mentioned ion trapping agent includes bismuth hydroxide, hydrotalcite compounds, and the like.

The above-mentioned flame retarder includes brominated novolak epoxy resins, brominated bisphenol A epoxy resins, metal compounds such as antimony trioxide, antimony pentoxide, metal hydroxides such as magnesium hydroxide and aluminum hydroxide, red phosphorus, phosphorus-containing compounds such as phosphates, and the like. These flame retarders can be used alone or in admixture of two or more kinds.

Further, as a flame retarder other than the flame retarders mentioned above, there can be used composite metal hydroxide having a polyhedral shape represented by the general formula (2)

$$M_{1-x}Q_x(OH)_2 \qquad (2)$$

wherein M is at least one metal atom selected from the group consisting of Mg, Ca, Sn and Ti; Q is at least one metal atom selected from the group consisting of Mn, Fe, Co, Ni, Cu and Zn; and X is a positive number of 0.01 to 0.5. This composite metal hydroxide has the crystalline structure of a polyhedral form. It does not have a conventional hexahedral form, or a plate-like form having thin thickness such as scaly form for the crystalline structure. Rather, it refers to a composite metal hydroxide having large crystal growth in the direction of thickness (c-axis direction) as well as in the length and width directions, including, for instance, those having a granular crystalline form which are made to resemble steric and spherical form by the crystal growth of plate-like crystal in the direction of thickness (c-axis direction), the granular crystalline forms including, approximate dodecahedron, approximate octahedron, approximate tetrahedron, and the like.

For instance, the composite metal hydroxide having large crystal growth in the direction of thickness (c-axis direction) as well as in the length and width directions, and a desired polyhedral crystalline form, can be obtained by controlling various conditions in the manufacturing process of the composite metal hydroxide, and may be usually a mixture of various shapes.

Concrete representative examples of the composite metal hydroxide include a hydrate of magnesium oxide and nickel oxide, a hydrate of magnesium oxide and zinc oxide, a hydrate of magnesium oxide and copper oxide, and the like.

In addition, the composite metal hydroxide having a polyhedral form has an aspect ratio of usually from 1 to 8, preferably from 1 to 7, especially preferably from 1 to 4. The aspect ratio referred to herein is expressed by a ratio of length to width of the composite metal hydroxide. In other words, in a case where the aspect ratio exceeds 8, the effect on a decrease in viscosity becomes poor when an epoxy resin composition comprising the composite metal hydroxide is melted.

The tablet made from the above materials can be prepared, for instance, as follows. In other words, the above-mentioned epoxy resin composition is dry-blended with a mixer, for instance, a Henschel mixer, and the resulting mixture is melt-kneaded with a kneading extruder. Thereafter, the molten product is filled into a tablet mold, and the filled material is pressed with cooling the above-mentioned mold by allowing water to flow through the mold. After termination of cooling, the formed tablet is taken out from the mold to give a tablet.

In the above-mentioned preparation steps, it is preferable that the melt-kneading temperature is adjusted to 60° to 150° C., that a molten resin temperature during filling is adjusted to 80 to 120° C., and that a mold temperature is adjusted to 5° to 50° C., respectively.

In the pressure-molding of the molten resin within the above-mentioned mold, a preferable method comprises arranging the upper and lower plungers in the tablet mold so that the mold can be closed with the motion of the plungers, and molding a molten resin composition fed to the tablet mold by the operation of the plungers, with pressing at a pressure of $490 \times 10^4$ to $2940 \times 10^4$ Pa or so.

Further, the production process of the tablet will be explained more concretely hereinbelow. FIG. 1 is a view showing one example of a production apparatus for producing a tablet. 11 Is a kneading extruder, which comprises a cylinder 12 in which a screw (not illustrated in the figure) is installed. 13 Is a mold holder which moves in left and right directions along a tracking rail 14, and is equipped with a cooling jacket. Also, 16 is a tablet mold, which is closed by an upper plunger 17 and a lower plunger 18. 19 Is a resin feed pipe attached at tip end of the cylinder 12 of the kneading extruder 11, in which a stirrer is installed, and a discharge outlet 20 is slidably contacted to an upper face of the mold. In FIG. 1, 21 is a tablet delivery mechanism.

In order to produce a tablet by using the production apparatus described above, first, a mixture is prepared by mixing each of the above-mentioned components with a Henschel mixer. Next, this mixture is delivered into a hopper (not illustrated in the figure) of a kneading extruder 11, and the resin composition in the above hopper is delivered into a cylinder 12 of the kneading extruder 11 by rotation of a screw installed in the cylinder 12. The resin composition is kneaded with heat melting at a temperature of from 60° to 150° C., and the molten epoxy resin composition is filled in a tablet mold 16 via a resin feed pipe 19 by an extrusion force of the screw. Thereafter, after the filling of the molten epoxy resin composition in the tablet mold 16 is completed, a mold holder 13 moves right (or left). When the left (or left) tablet mold 16 reaches the position of a discharge outlet 20 of the resin feed pipe 19, the mold holder 13 is stopped. The molten epoxy resin composition filled in the tablet mold 16 moved right (or left) is molded with pressing with an upper plunger 17 and a lower plunger 18 at a pressure of $490 \times 10^4$ to $2940 \times 10^4$ Pa or so. Cooled water of which temperature is adjusted to 5° to 50° C. is circulated through the cooling jacket of the mold holder 13.

Next, the cooled resin (25° to 60° C. or so) is ejected upwardly by the lower plunger 18, and the ejected resin, i.e. the tablet, was discharged in a forward direction by a tablet delivery mechanism 21. Thereafter, on completion of filling of the resin in the left (or right) mold, the mold moves right (or left), and the above-operation is repeated, whereby tablets can be produced in a continuous manner.

The tablet produced as described above is required to have the following characteristic (A):

(A): an amount reduced by heating being less than 0.05% by weight.

The amount reduced by heating is preferably 0.04% by weight or less, more preferably 0.03% by weight or less.

Further, it is more preferable that the tablet has at least one characteristic selected from the group consisting of:

(B): a compression ratio of the tablet being 98% or more, preferably 99% or more, more preferably 99.3% or more; and (C): a glass transition temperature of the cured product being 120° C. or more, preferably 130° C. or more.

In the above-mentioned characteristics (A) and (B), the more the amount reduced by heating [characteristic (A)] approximates 0% by weight, the more preferable, and the more the compression ratio of the tablet [characteristic (B)] approximates 100%, the more preferable.

The amount reduced by heating in the above-mentioned characteristic (A) is obtained as follows. Specifically, the obtained tablet is heated at 175° C. for 1 hour, and the weights before and after heating are determined, and the amount reduced by heating is calculated as follows:

$$\text{Amount Reduced by Heating (\% by weight)} = \frac{\text{(Initial Weight)} - \text{(Weight after Heating)}}{\text{(Initial Weight)}} \times 100$$

The compression ratio in the characteristic (B) of the tablet is obtained as follows. Specifically, the compression ratio of the above-mentioned tablet is a ratio of an apparent specific gravity of the tablet and a specific gravity where voids inside the tablet are zeroed (true specific gravity). For instance, when a specific gravity of the resin cured product of the tablet is denoted by $\rho$, a volume of the tablet is denoted by V, and a weight of the tablet is denoted by W, the compression ratio of the tablet can be calculated by the following equation:

$$\text{Compression Ratio of Tablet (\%)} = \left[\frac{(W/\rho)}{V}\right] \times 100$$

The above-mentioned resin cured product of the tablet can be obtained by curing the resin composition with a transfer molding machine at 175° C. for 10 minutes under a pressure of $1960 \times 10^4$ Pa or so.

The glass transition temperature in the above-mentioned characteristic (C) of the cured product is obtained as follows.

Specifically, the above-mentioned tablet is cured by a transfer molding machine at 175° C. for 10 minutes, to give a resin cured product (size: 4 mm×3 mm×thickness 20 mm). The resin cured product is cured at 175° C. for 5 hours, and then dried at 95° C. for 24 hours. Thereafter, the elongation of the above-mentioned cured product of the epoxy resin composition is determined by using a thermomechanical analyzer (TMA device commercially available from Rigaku, model number MJ-800GM) in a temperature range of 30° to 250° C., and a glass transition temperature can be obtained from this determination. The determination condition is a heating rate of 5° C./minute.

Figure 2:
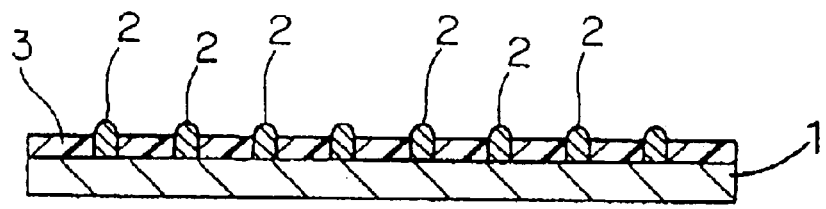
FIG. 2 is a cross-sectional view showing one example of a wafer with a resin layer.

A first embodiment of the present invention pertains to a wafer with a resin layer produced by using a tablet. As shown in FIG. 2, the wafer with a resin layer 1 of the present invention comprises a plural projected electrodes 2 and a cured resin layer 3 formed on a projected electrode-mounting side of the wafer 1. In the present invention, a wafer refers to a thin plate semiconductor in which an electrode layer as well as the above-mentioned projected electrodes 2 is mounted on the surface thereof.

Figure 3:
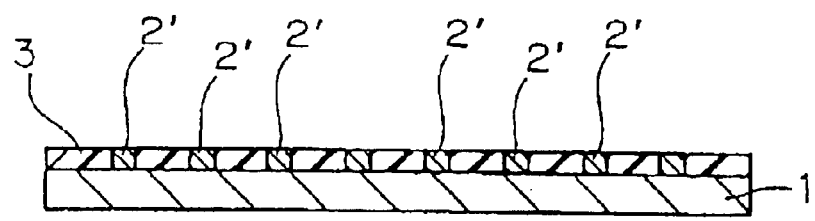
FIG. 3 is a cross-sectional view showing another example of a wafer with a resin layer.

FIG. 3 is another example of the wafer with a resin layer of the present invention. Specifically, a wafer with a resin layer is formed such that a surface of a cured resin layer formed on a wafer 1 shares the same plane with a tip end of the projected electrodes 2'.

The material for the above-mentioned plural projected electrodes 2 is not particularly limited. The material includes, for instance, gold, silver, copper, aluminum, nickel, chromium, tin, lead, solder, and alloys thereof. In addition, the shape of the above-mentioned plural projected electrodes 2 is not particularly limited. It is preferable that the surface of the electrodes has projected shape.

The material for the above-mentioned wafer 1 is not particularly limited, and there are included any of ones conventionally used, for instance, GaAs wafer, Si wafer, and the like.

The above-mentioned cured resin layer 3 is formed by using the tablet of the present invention, and the feature of the present invention resides in that a semiconductor element is sealed by using the tablet as described above.

The resin with a wafer of the present invention can be prepared by using the above-mentioned tablet, heat-melting the tablet by means of transfer molding, compression forming, or the like to form a resin layer on a wafer, and curing the resin layer. In other words, the wafer with a resin layer can be prepared by putting the tablet of the present invention on the projected electrode-mounting side of the wafer, and heating the tablet and melting and curing it to form a cured resin layer.

In the process for producing the above-mentioned wafer with a resin layer, the heating temperature at which the tablet is heated and melted to give a molten state is preferably in a range of from 130° to 200° C., especially preferably from 150° to 190° C.

The heating temperature at which the above-mentioned resin layer is cured to form a cured resin layer is preferably in a range of from 150° to 190° C.

In the wafer with a resin layer obtained by using the above-specified tablet, the size of the wafer, for instance, is such that the diameter is usually in the range of 12.7 to 30.48 cm.

In the preparation of the wafer with a resin layer formed by the above-mentioned compression molding method, there is employed a method of exposing a tip end of the projected electrodes from the side of the cured resin layer by using, for instance, a film, without being limited to this method.

Besides the above-mentioned method using a film, there is included, for instance, a method comprising irradiating laser beam on the cured resin layer-forming side of the wafer with a resin layer which is in a state such that all of the projected electrodes are embedded in the cured resin layer to remove the surface of the cured resin layer, thereby exposing a tip end of the projected electrodes from the cured resin layer surface. As a substitute of laser beam irradiation mentioned above, there is included a method employing etching treatment, mechanical polishing, blasting treatment or the like. In the laser beam irradiation mentioned above, YAG laser, carbon dioxide gas laser, excimer laser, or the like can be employed.

Figure 4:
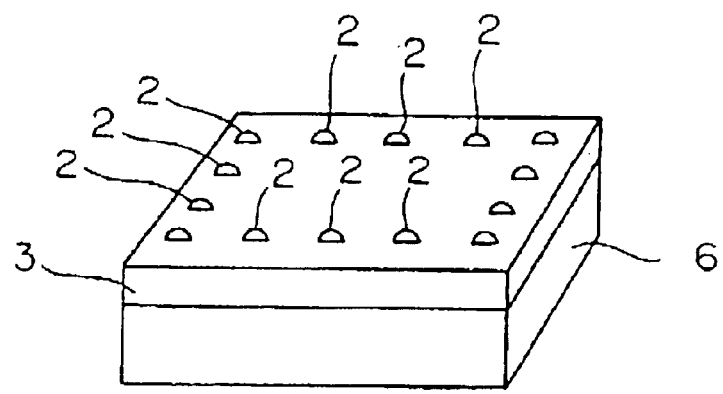
FIG. 4 is a perspective view of one example of a semiconductor device.

Thereafter, the wafer with a resin layer obtained by the above process is diced into a given size (size of semiconductor element unit), whereby a semiconductor device can be obtained, in which as shown in FIG. 4, a cured resin layer 3 is formed on a plural projected electrodes 2-mounting side of a semiconductor element 6 so that a tip end of the above-mentioned projected electrodes 2 is exposed.

The method for dicing-the above-mentioned wafer with a resin layer to a given size is not particularly limited, and any of conventionally known methods such as diamond scriber method, laser scriber method, blade dicing method, and the like can be employed.

Figure 5:
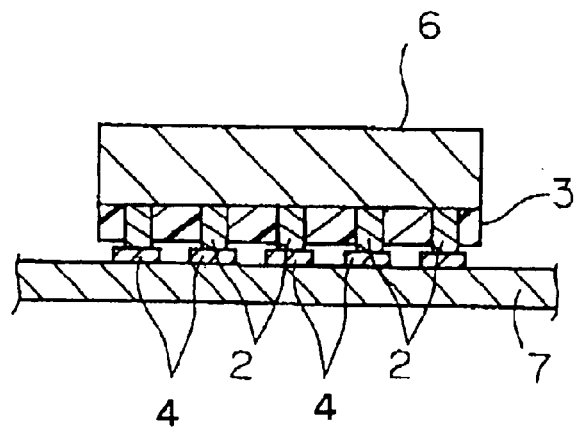
FIG. 5 is a cross-sectional view showing a state in which a semiconductor device is mounted on a printed circuit substrate.

The above-mentioned semiconductor device obtained by dicing the wafer into a given size can be used in an embodiment, for instance, as shown in FIG. 5, a semiconductor device is mounted on a printed circuit substrate 7 so that a connecting electrode 4 of the printed circuit substrate is bonded with a projected electrode 2 of the semiconductor device.

Figure 6:
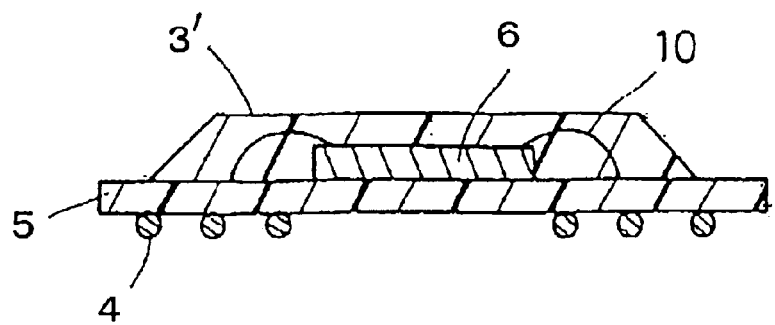
FIG. 6 is a cross-sectional view showing one example of a one-sided sealing-type semiconductor device.

A second embodiment of the present invention pertains to a one-sided sealing type package which is a semiconductor device comprising an insulating substrate, a semiconductor element mounted on one side of the insulating substrate, and a cured product of the tablet of the present invention, the semiconductor element being incorporated in and sealed by the cured product. Concrete examples of the semiconductor device of the present invention in which the semiconductor element is incorporated in and sealed by the cured product include semiconductors in package forms which are so-called "BGA (Ball Grid Array)," as shown in FIG. 6. In this semiconductor device, a semiconductor element 6 is mounted on an insulating substrate 5, and the above-mentioned semiconductor element 6 is sealed by the cured product 8 of the tablet of the present invention. The sealing by the epoxy resin composition is carried out only on the semiconductor element 6-mounting side of the insulating substrate 5 (one-sided sealing). An approximate spherical connecting electrode 4 is provided on the side opposite to the side of sealing the semiconductor element of the insulating substrate 5. In FIG. 6, 10 is a wire.

The above-mentioned substrate material is not particularly limited, and any of various conventionally known substrate materials can be used. Concrete examples thereof include bismaleimidotriazine (BT) resin/glass cloth substrates, epoxy resin/glass cloth substrates, polyimide substrates, ceramic substrates, and the like.

The process for production of the semiconductor device of the present invention in which the semiconductor element is incorporated in and sealed by a cured product of the epoxy resin composition is not particularly limited, and the semiconductor device can be produced by a conventionally known method, for instance low-pressure transfer molding method or the like. Specifically, the semiconductor device can be produced by putting the tablet of the present invention on a semiconductor element, and heating to melt and cure the tablet, to form a cured product of the epoxy resin composition.

Figure 7:
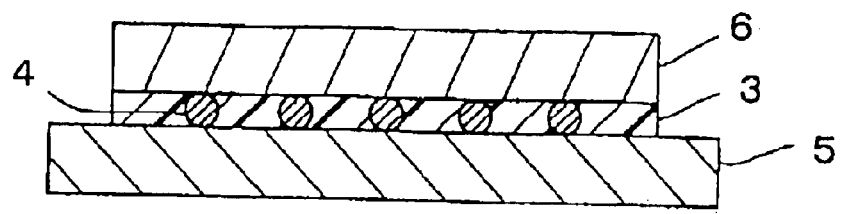
FIG. 7 is a cross-sectional view showing one example of a semiconductor device having a face down structure.

A third embodiment of the present invention pertains to a semiconductor device in which a semiconductor element is mounted on one side of a mother board or a daughter board in a face down structure (flip chip method, direct chip attachment method, or the like), and a process for producing the semiconductor device. The semiconductor device having a face down structure of the present invention, as shown in FIG. 7, has a structure in which a semiconductor element 6 is mounted on one side of an insulating substrate 5 via a plural connecting electrodes 4. Therefore, a cured resin layer 3 is formed between the above-mentioned insulating substrate 5 and the semiconductor element 6.

The above-mentioned plural connecting electrodes 4 which electrically connect the above-mentioned insulating substrate 5 with the semiconductor element 6 may be previously mounted on the side of the insulating substrate 5, or the plural connecting electrodes 4 may be respectively mounted on the side of the insulating substrate 5 and the side of the semiconductor element 6.

In the present invention, the connecting electrode may be referred to those only composed of known electrodes, and also include those composed of an electrode and a conductor equipped with the electrode such as joint ball. Therefore, in general, the connecting electrodes of the insulating substrate may be communicated with the connecting electrodes of the semiconductor elements only by electrodes. However, it is preferable that the electrodes of the connecting electrodes are usually communicated in such a manner that the connecting electrode comprises a plural electrodes and a joint ball attached to at least one side of the electrodes.

Therefore, in a preferred embodiment, the plural connecting electrodes 4 which electrically connect the insulating substrate 5 with the semiconductor element 6 may be previously provided with a joint bump, a joint ball or the like on the side of the insulating substrate 5, or provided with a joint bump, a joint ball or the like on the side of the insulating substrate 6. Further, the plural connecting electrodes may be both provided with a joint bump, a joint ball or the like on the side of the insulating substrate 5 as well as on the side of the semiconductor element 6.

The materials for the above-mentioned plural connecting electrodes 4 (joint bump, joint ball or the like) are not particularly limited. The materials therefor include a stud bump made of gold, low-melting point and high-melting point bumps made of soldering, a bump comprising a copper-nickel core and gold plating formed thereon, excluding a case in which both the side of the semiconductor element and the side of the insulating substrate are subjected to gold plating or take the form of stud bump made of gold.

In addition, the materials for the above-mentioned insulating substrate 5 are not particularly limited and include ceramic substrates and plastic substrates. The plastic substrate includes, for instance, epoxy substrates, bismaleimidotriazine (BT) resin/glass cloth substrates, polyimide substrates, and the like.

Accordingly, the above-mentioned cured resin layer 3 is formed by using the tablet of the present invention, and the feature of the present invention resides in sealing the semiconductor element by using the tablet described above.

The semiconductor device having a face down structure of the present invention can be, for instance, produced in the following manner.

Figure 8:
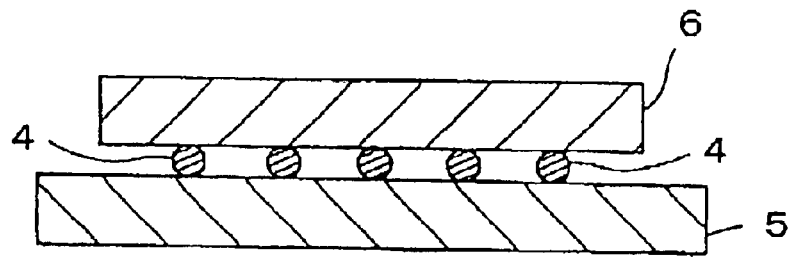
FIG. 8 is a cross-sectional view showing a production process of a semiconductor device having a face down structure.

First, as shown in FIG. 8, a semiconductor element 6 is mounted on an insulating substrate 5 via the connecting electrodes 4, the insulating substrate 5 on which plural spherical connecting electrodes (joint balls) 4 are mounted. Subsequently, a specified tablet is fed into a molding machine, thereafter this tablet is heat-melted to give a molten state, and the molten product is pressed. The void between the above-mentioned semiconductor element 6 and the above-mentioned insulating substrate is filled with the tablet in the molten state, and the epoxy resin composition is cured to seal the void mentioned above, thereby forming a cured resin layer 3. As described above, a semiconductor device as shown in FIG. 7 can be produced.

In addition, in the process for producing the above-mentioned semiconductor device, the heating temperature when the above-mentioned tablet is heated and melted to give a molten state is preferably in the range of 70° to 300° C., especially preferably in the range of 120° to 200° C., in consideration of deterioration of the semiconductor element 6 and the insulating substrate 5, and the like. The heating means include infrared reflow furnace, dryer, hot-air fan, hot plate, and the like.

Figure 9:
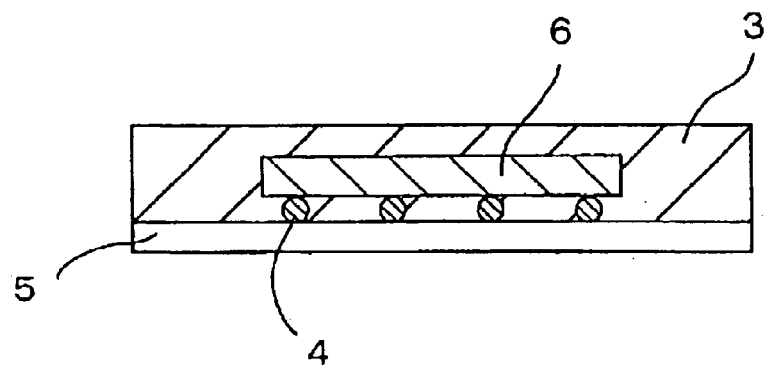
FIG. 9 is a cross-sectional view showing another example of a semiconductor device having a face down structure.
Figure 10:
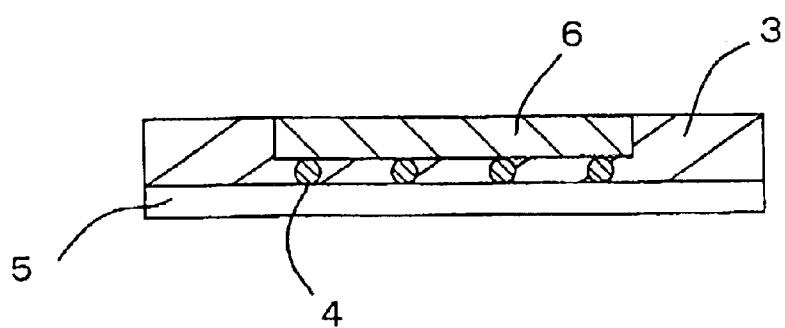
FIG. 10 is a cross-sectional view showing still another example of a semiconductor device having a face down structure.

Further, when the above-mentioned tablet in the molten state is filled in the void between the above-mentioned semiconductor element 6 and the insulating substrate 5, it is preferable that the molten tablet is pressed as mentioned above. The pressing conditions can be properly adjusted by the number of the connecting electrodes (joint balls) 4, and the like. Concretely, the pressure is adjusted to a range of preferably $490\times10^4$ to $1960\times10^4$ Pa, more preferably $588\times10^4$ to $1176\times10^4$ Pa. FIG. 9 and FIG. 10 each is a cross-sectional view showing an example of a semiconductor device having a face down structure, wherein the numerals represented herein are the same as those in FIG. 7.

In the semiconductor device obtained by using the specified tablet, it is preferable that the size of the semiconductor element 6, for instance, is usually adjusted to a size of 5 to 30 mm in width, 5 to 30 mm in length, 0.1 to 0.8 mm in thickness. In addition, it is preferable that the size of the insulating substrate 5 which forms a wiring circuit on which the semiconductor element 6 is mounted is usually adjusted to a size of 10 to 100 mm in width, 10 to 100 mm in length, and 0.1 to 3.0 mm in thickness. It is preferable that the distance of the void between the semiconductor element 6 and the insulating substrate 5 to which the molten sealing resin is filled is usually adjusted to 5 to 100 $\mu$m.

EXAMPLES

Example A

First, prior to carrying out the Examples, each of the following components was prepared.

[Epoxy Resin A]

An epoxy resin (epoxy equivalence: 170, softening point: 60° C.), represented by the following formula:

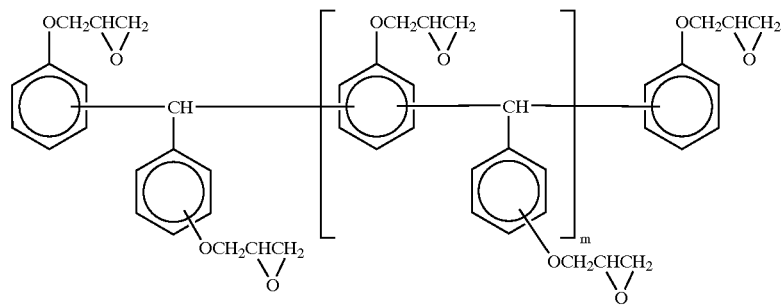

[Epoxy Resin B]

An epoxy resin (epoxy equivalence: 175, melting point: 142° C.), represented by the following formula:

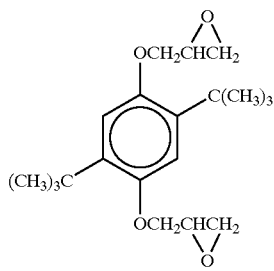

[Curing Agent]

A phenol novolak resin (hydroxyl group equivalence: 105, softening point 60° C.)

[Curing Accelerator]

1,5-diazabicyclo[4.3.0]nonene-5 (DBN)

Tetraphenylphosphonium tetraphenylborate (TPP-K)

[Spherical Silica Powder]

Spherical fused silica powder (average particle size: 3 μm)

[Coupling Agent]

γ-Methacryloxypropyltriethoxysilane

Examples A1 to A6

Each of the components shown in Table 1 given below was supplied to a Henschel mixer in proportions shown in the same table, and the components were mixed therein for 30 minutes. Thereafter, the resulting mixture was supplied into a kneading extruder shown in FIG. 1 described above, and a tablet comprising an epoxy resin composition was prepared in the manner described above. Specifically, the molten resin composition was injected into a tablet mold (inner diameter: 13 mm, height: 20 mm) with an extrusion force exerted by the kneading extruder, and the injected resin composition was pressure molded under a pressure of $1 \times 10^7$ Pa, with circulating cooled water in the mold holder at a temperature of 20° C. The resulting tablet was ejected from the mold by the upward lunge of the lower plunger, to give an epoxy resin composition tablet.

Comparative Examples A1 to A3

Each of the components shown in Table 2 given below was formulated in proportions shown in the same table and melt-kneaded in a mixing roller at a temperature of 100° C. for 3 minutes. The melt-kneaded mixture was cooled and solidified, and thereafter pulverized and tableted, to give an epoxy resin composition tablet.

Comparative Example A4

Each of the components shown in Table 2 given below was formulated in proportions shown in the same table. Each epoxy resin composition tablet was prepared in the same manner as Examples A1 to A6 so as to have an amount reduced by heating and a compression ratio as shown in Table 2.

Using each epoxy resin composition tablet as obtained above, the amount reduced by heating, the compression ratio, the glass transition temperature of the cured product were respectively determined in accordance with the method described above. The results are also shown in Tables 1 and 2.

TABLE 1

(parts by weight)

| | Example No. | | | | | |
|---|---|---|---|---|---|---|
| | A1 | A2 | A3 | A4 | A5 | A6 |
| Epoxy Resin A | 100 | 100 | 100 | 100 | 100 | 30 |
| Epoxy Resin B | — | — | — | — | — | 60 |
| Brominated Epoxy Resin | 13 | 13 | — | — | — | 15 |
| Phenol Novolak Resin | 60 | 60 | 60 | 60 | 60 | 60 |
| DBN | 1 | 1 | 1 | 1 | 1 | — |
| TPP-K | — | — | — | — | — | 7 |
| Spherical Silica Powder | 1200 | 680 | 700 | 700 | 700 | 680 |
| Coupling Agent | 1.8 | 1.8 | 1.8 | 1.8 | 1.8 | 1.8 |
| Carbon Black | 7 | 7 | 7 | 7 | 7 | 7 |
| Antimony Trioxide | 11 | 14 | — | — | — | 14 |
| Carnauba Wax | 1 | 1 | 1 | 1 | 1 | 1 |
| Amount Reduced by Heating (% by weight) | 0.04 | 0.03 | 0.03 | 0.02 | 0.03 | 0.04 |
| Compression Ratio (%) | 99.5 | 99.5 | 99.5 | 99.5 | 98.0 | 99.5 |
| Glass Transition Temperature (° C.) | 180 | 178 | 178 | 178 | 178 | 145 |

TABLE 2

(parts by weight)

| | Comparative Example No. | | | |
|---|---|---|---|---|
| | A1 | A2 | A3 | A4 |
| Epoxy Resin A | 100 | 100 | 100 | 40 |
| Epoxy Resin B | — | — | — | 80 |

TABLE 2-continued

|  | (parts by weight) Comparative Example No. | | | |
|---|---|---|---|---|
|  | A1 | A2 | A3 | A4 |
| Brominated Epoxy Resin | — | — | — | — |
| Phenol Novolak Resin | 60 | 60 | 60 | 50 |
| DBN | 1 | 1 | 1 | 1 |
| TPP-K | — | — | — | — |
| Spherical Silica Powder | 700 | 700 | 700 | 700 |
| Coupling Agent | 1.8 | 1.8 | 1.8 | 1.8 |
| Carbon Black | 7 | 7 | 7 | 7 |
| Antimony Trioxide | — | — | — | — |
| Carnauba Wax | 1 | 1 | 1 | 1 |
| Amount Reduced by Heating (% by weight) | 0.06 | 0.15 | 0.19 | 0.12 |
| Compression Ratio (%) | 98.0 | 98.0 | 93.0 | 99.5 |
| Glass Transition Temperature (° C.) | 175 | 175 | 175 | 129 |

Thereafter, the wafer with a resin layer was prepared in the following manner by using each epoxy resin composition tablet obtained above. Specifically, a wafer comprising a plural projected electrodes was mounted on a lower mold of the molds for producing a semiconductor device comprising an upper mold and a lower mold in such a manner that the projected electrodes were facing the upper mold. At the same time, the above-mentioned epoxy resin composition tablet was mounted on the wafer, and a film commercially available from NITTO DENKO CORPORATION under the trade name MPS-31 was provided between this tablet and the upper mold. Next, an entire mold was heated to 175° C. by using a heater installed in the above-mentioned mold for producing the semiconductor device, and the tablet was compressed at a pressure of 9800 N by dropping the upper mold downwardly. A resin layer (uncured) was formed on a projected electrode-mounting side of the wafer, with compression-deforming the tablet softened by heating. By repeating the above processes, a resin layer having a thickness of 100 μm is formed on a side comprising projected electrodes of the wafer.

Next, the above-mentioned resin layer was cured by heating (175° C.), to form a cured resin layer. Thereafter, the wafer with formed cured resin layers was taken out of the mold, and the film commercially available from NITTO DENKO CORPORATION secured to the cured resin layer was peeled off, whereby exposing tip ends of the projected electrodes in an embedded state to the film. Thus, there was prepared a wafer with a resin layer as shown in FIG. 2 comprising a plural projected electrodes 2 and a cured resin layer 3 formed on a projected electrode-mounting side of the wafer 1.

Wafer used: 8 inch (20.32 cm) wafer, thickness: 680 μm, made of Si

The bowing of each wafer with a resin layer as obtained above was determined by the method described below. The results are shown in Tables 3 and 4.

[Determination of Bowing of Wafer with Resin Layer]

Figure 11:
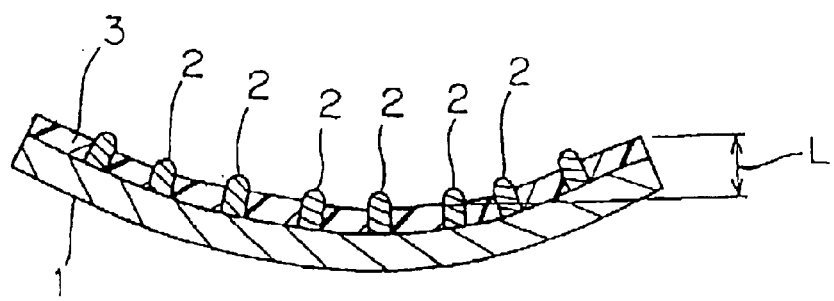
FIG. 11 is a cross-sectional view showing a state in which bowing of a wafer with a resin layer is determined.

The bowing was determined for each of the resulting wafers with a resin layer by measuring an extent of bowing L shown in FIG. 11 using a microdepth meter. In FIG. 11, 3 is a cured resin layer (cured product of an epoxy resin composition), 1 is a wafer, and 2 is projected electrodes.

TABLE 3

|  | Example No. | | | | | |
|---|---|---|---|---|---|---|
|  | A1 | A2 | A3 | A4 | A5 | A6 |
| Bowing L (mm) | 1.5 | 1.3 | 1.5 | 1.4 | 1.5 | 1.9 |

TABLE 4

|  | Comparative Example No. | | | |
|---|---|---|---|---|
|  | A1 | A2 | A3 | A4 |
| Bowing L (mm) | 2.4 | 3.0 | 4.5 | 5.2 |

As is clear from Tables 3 and 4, it can be seen that the products of Examples have very small values of bowing as compared with those of Comparative Examples, so that a wafer with a resin layer having high reliability can be obtained. Therefore, a semiconductor device obtained by dicing the wafer with a resin layer of the products of Examples to a given size by a blade dicing method of course has little bowing and high reliability.

Example B

First, prior to the Examples, each of the following components was prepared.

[Epoxy Resin A]

The same as Epoxy Resin A in Example A

[Epoxy Resin B]

An epoxy resin (epoxy equivalence: 173, melting point: 100° C.), represented by the following formula:

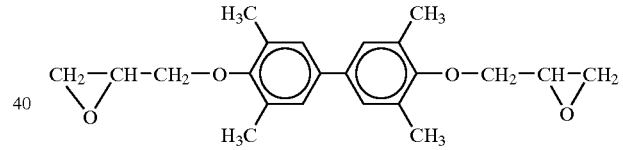

[Epoxy Resin C]

The same as Epoxy Resin B in Example A

[Curing Agent]

A phenol novolak resin (hydroxyl group equivalence: 105, softening point 60° C.)

[Curing Accelerator]

1,5-diazabicyclo[4.3.0]nonene-5 (DBN)

[Spherical Silica Powder]

Spherical fused silica powder (average particle size: 25 μm)

[Composite Metal Hydroxide]

$Mg_{0.8}Zn_{0.2}(OH)_2$ (polyhedral shape, average particle size: 1.7 μm)

[Coupling Agent]

γ-Methacryloxypropyltriethoxysilane

Examples B1 to B6

Each of the components shown in Table 5 given below was supplied to a Henschel mixer in proportions shown in the same table, and the components were mixed therein for 30 minutes. Thereafter, the resulting mixture was supplied into a kneading extruder shown in FIG. 1 described above, and a epoxy resin composition tablet was prepared in the manner described above. Specifically, the molten resin composition was injected into a tablet mold (inner diameter: 13 mm, height: 20 mm) with an extrusion force exerted by the kneading extruder, and the injected resin composition was pressure molded under a pressure of 980×10⁴ Pa, with circulating cooled water in the mold holder at a temperature of 20° C. The resulting tablet was ejected from the mold by the upward lunge of the lower plunger, to give an epoxy resin composition tablet.

Comparative Examples B1 to B5

Each of the components shown in Table 6 given below was formulated in proportions shown in the same table and melt-kneaded in a mixing roller at a temperature of 100° C. for 3 minutes. The melt-kneaded mixture was cooled and solidified, and thereafter pulverized and tableted, to give an epoxy resin composition tablet.

Using each epoxy resin composition tablet as obtained above, the amount reduced by heating, the compression ratio, the glass transition temperature of the cured product were respectively determined in accordance with the method described above. The results are also shown in Tables 5 and 6.

TABLE 5

(parts by weight)

| | Example No. | | | | | |
|---|---|---|---|---|---|---|
| | B1 | B2 | B3 | B4 | B5 | B6 |
| Epoxy Resin A | 100 | 30 | 30 | 30 | 30 | 15 |
| Epoxy Resin B | — | 70 | — | 70 | 70 | — |
| Epoxy Resin C | — | — | 70 | — | — | 85 |
| Phenol Novolak Resin | 66 | 65 | 60 | 60 | 60 | 60 |
| DBN | 1 | 1.5 | 1.5 | 1.5 | 1.5 | 1.5 |
| Brominated Epoxy Resin | 10 | 10 | 10 | — | — | 10 |
| Spherical Silica Powder | 1200 | 1600 | 1500 | 1400 | 1400 | 1600 |
| Composite Metal Hydroxide | — | — | — | 100 | 15 | — |
| Red Phosphorus | — | — | — | — | 1 | — |
| Coupling Agent | 2 | 2 | 2 | 2 | 2 | 2 |
| Carbon Black | 3 | 3 | 3 | 3 | 3 | 3 |
| Antimony Trioxide | 10 | 10 | 10 | — | — | 10 |
| Carnauba Wax | 3 | 3 | 3 | 3 | 3 | 3 |
| Amount Reduced by Heating (% by weight) | 0.04 | 0.03 | 0.03 | 0.03 | 0.04 | 0.03 |
| Compression Ratio (%) | 99.5 | 99.5 | 99.5 | 99.0 | 100 | 100 |
| Glass Transition Temperature (° C.) | 180 | 160 | 160 | 160 | 160 | 145 |

TABLE 6

(parts by weight)

| | Comparative Example No. | | | | |
|---|---|---|---|---|---|
| | B1 | B2 | B3 | B4 | B5 |
| Epoxy Resin A | 100 | 100 | 30 | 30 | — |
| Epoxy Resin B | — | — | 70 | 70 | — |
| Epoxy Resin C | — | — | — | — | 100 |
| Phenol Novolak Resin | 66 | 66 | 65 | 65 | 60 |

TABLE 6-continued (parts by weight)

| | Comparative Example No. | | | | |
|---|---|---|---|---|---|
| | B1 | B2 | B3 | B4 | B5 |
| DBN | 1 | 1 | 1.5 | 1.5 | 2.0 |
| Brominated Epoxy Resin | 10 | 10 | 10 | 10 | 10 |
| Spherical Silica Powder | 1200 | 1200 | 1600 | 1600 | 1400 |
| Composite Metal Hydroxide | — | — | — | — | — |
| Red Phosphorus | — | — | — | — | — |
| Coupling Agent | 2 | 2 | 2 | 2 | 2 |
| Carbon Black | 3 | 3 | 3 | 3 | 3 |
| Antimony Trioxide | 10 | 10 | 10 | 10 | 10 |
| Carnauba Wax | 3 | 3 | 3 | 3 | 3 |
| Amount Reduced by Heating (% by weight) | 0.06 | 0.11 | 0.08 | 0.09 | 0.06 |
| Compression Ratio (%) | 95.0 | 99.5 | 98.5 | 95.0 | 97.0 |
| Glass Transition Temperature (° C.) | 180 | 180 | 160 | 160 | 125 |

Thereafter, a one-sided sealing-type semiconductor device was produced by using each epoxy resin composition tablet obtained in the manner described above, and subjecting a semiconductor element mounted on an insulating substrate to transfer-molding (conditions: 175° C. for 2 minutes, and after-curing of 175° C. for 5 hours). The resulting semiconductor device was as follows.

Size of sealed part (cured product of an epoxy resin composition): 35 mm×35 mm×1.2 mm in thickness
Size of semiconductor element: 12 mm×12 mm×0.4 mm in thickness
Size of insulating substrate: 40 mm×40 mm×0.6 mm in thickness
Materials for insulating substrate: bismaleimidotriazine (BT) resin/glass cloth substrate (commercially available from Mitsubishi Gas Chemical Company, Inc.)

The bowing of each semiconductor device as obtained above was determined by the method described below. The results are shown in Tables 7 and 8.

[Determination of Bowing of Semiconductor Device]

Figure 12:
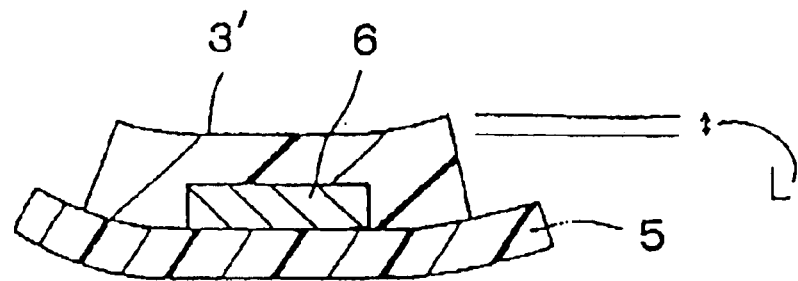
FIG. 12 is a cross-sectional view showing a state in which bowing of a wafer with a resin layer is determined.

The bowing was determined for each of the resulting semiconductor devices by measuring an extent of bowing L using a microdepth meter shown in FIG. 12. In FIG. 12, 3' is a cured product of an epoxy resin composition, 6 is a semiconductor element, and 5 is an insulating substrate.

TABLE 7

| | Example No. | | | | | |
|---|---|---|---|---|---|---|
| | B1 | B2 | B3 | B4 | B5 | B6 |
| Bowing L (μm) | 40 | 50 | 50 | 50 | 50 | 65 |

TABLE 8

| | Comparative Example No. | | | | |
|---|---|---|---|---|---|
| | B1 | B2 | B3 | B4 | B5 |
| Bowing L (μm) | 90 | 120 | 90 | 150 | 210 |

As is clear from Tables 7 and 8, it can be seen that the products of Examples have very small values of bowing as compared with those of Comparative Examples, so that a semiconductor device having high reliability can be obtained.

Example C

First, prior to the Examples, each of the following components was prepared.

[Epoxy Resin A]

The same as Epoxy Resin A in Example A

[Epoxy Resin B]

The same as Epoxy Resin B in Example A

[Curing Agent]

A phenol novolak resin (hydroxyl group equivalence: 105, softening point 60° C.)

[Curing Accelerator]

1,5-diazabicyclo[4.3.0]nonene-5 (DBN)

Tetraphenylphosphonium tetraphenylborate (TPP-K)

[Spherical Silica Powder]

Spherical fused silica powder (average particle size: 5 μm)

[Coupling Agent]

γ-Methacryloxypropyltriethoxysilane

Examples C1 to C6

Each of the components shown in Table 9 given below was supplied to a Henschel mixer in proportions shown in the same table, and the components were mixed therein for 30 minutes. Thereafter, the resulting mixture was supplied into a kneading extruder shown in FIG. 2 described above, and an epoxy resin composition tablet was prepared in the manner described above. Specifically, the molten resin composition was injected into a tablet mold (inner diameter: 13 mm, height: 20 mm) with an extrusion force exerted by the kneading extruder, and the injected resin composition was pressure molded under a pressure of $1 \times 10^7$ Pa, with circulating cooled water in the mold holder at a temperature of 20° C. The resulting tablet was ejected from the mold by the upward lunge of the lower plunger, to give an epoxy resin composition tablet.

Comparative Examples C1 to C3

Each of the components shown in Table 10 given below was formulated in proportions shown in the same table and melt-kneaded in a mixing roller at a temperature of 100° C. for 3 minutes. The melt-kneaded mixture was cooled and solidified, and thereafter pulverized and tableted, to give an epoxy resin composition tablet.

Comparative Example C4

Each of the components shown in Table 10 given below was formulated in proportions shown in the same table. Each epoxy resin composition tablet was prepared in the same manner as Examples C1 to C6 so as to have an amount reduced by heating and a compression ratio as shown in Table 10.

Using each epoxy resin composition tablet as obtained above, the amount reduced by heating, the compression ratio, the glass transition temperature of the cured product were respectively determined in accordance with the method described above. The results are also shown in Tables 9 and 10.

TABLE 9

(parts by weight)

| | Example No. | | | | | |
|---|---|---|---|---|---|---|
| | C1 | C2 | C3 | C4 | C5 | C6 |
| Epoxy Resin A | 100 | 100 | 100 | 100 | 100 | 30 |
| Epoxy Resin B | — | — | — | — | — | 60 |
| Brominated Epoxy Resin | 13 | 13 | — | — | — | 15 |
| Phenol Novolak Resin | 60 | 60 | 60 | 60 | 60 | 60 |
| DBN | 1 | 1 | 1 | 1 | 1 | — |
| TPP-K | — | — | — | — | — | 7 |
| Spherical Silica Powder | 1200 | 680 | 700 | 700 | 700 | 680 |
| Coupling Agent | 1.8 | 1.8 | 1.8 | 1.8 | 1.8 | 1.8 |
| Carbon Black | 7 | 7 | 7 | 7 | 7 | 7 |
| Antimony Trioxide | 11 | 14 | — | — | — | 14 |
| Carnauba Wax | 1 | 1 | 1 | 1 | 1 | 1 |
| Amount Reduced by Heating (% by weight) | 0.04 | 0.03 | 0.02 | 0.02 | 0.02 | 0.04 |
| Compression Ratio (%) | 99.5 | 99.5 | 99.5 | 99.5 | 98.0 | 99.5 |
| Glass Transition Temperature (° C.) | 180 | 178 | 178 | 178 | 178 | 145 |

TABLE 10

(parts by weight)

| | Comparative Example No. | | | |
|---|---|---|---|---|
| | C1 | C2 | C3 | C4 |
| Epoxy Resin A | 100 | 100 | 100 | 40 |
| Epoxy Resin B | — | — | — | 80 |
| Brominated Epoxy Resin | — | — | — | — |
| Phenol Novolak Resin | 60 | 60 | 60 | 50 |
| DBN | 1 | 1 | 1 | 1 |
| TPP-K | — | — | — | — |
| Spherical Silica Powder | 700 | 700 | 700 | 700 |
| Coupling Agent | 1.8 | 1.8 | 1.8 | 1.8 |
| Carbon Black | 7 | 7 | 7 | 7 |
| Antimony Trioxide | — | — | — | — |
| Carnauba Wax | 1 | 1 | 1 | 1 |
| Amount Reduced by Heating (% by weight) | 0.06 | 0.15 | 0.19 | 0.12 |
| Compression Ratio (%) | 98 | 98 | 93 | 99.5 |
| Glass Transition Temperature (° C.) | 175 | 175 | 175 | 129 |

Thereafter, a semiconductor device was prepared in the following manner by using each epoxy resin composition tablet obtained above. Specifically, as shown in FIG. 8, a semiconductor element 6 was mounted on an insulating substrate 5 on which a plural spherical connecting electrodes 4 were provided. Next, a specified epoxy resin composition tablet was supplied into a molding machine, thereafter this tablet was heated and molted to give a molten state, and the molten tablet was pressed. As described above, the void between the above-mentioned semiconductor element 6 and the above-mentioned insulating substrate 5 was filled with the molten resin described above, and the molten resin was cured to seal the void with the cured resin, thereby forming a cured resin layer 3. As described above, a semiconductor device was prepared. The temperature for heating and melting mentioned above was 175° C., and the pressing condition was adjusted to 600 Pa/one element.

Distance of the cured resin layer (distance in voids): 100 µm
Size of semiconductor element: 15 mm×15 mm×370 µm in thickness
Size of insulating substrate: 20 mm×20 mm×0.4 mm in thickness
Materials for insulating substrate: bismaleimidotriazine (BT) resin/glass cloth substrate (commercially available from Mitsubishi Gas Chemical Company, Inc.).

The bowing of each semiconductor device as obtained above was determined by the method described below. The results are shown in Tables 11 and 12.

[Determination of Bowing of Semiconductor]

Figure 13:
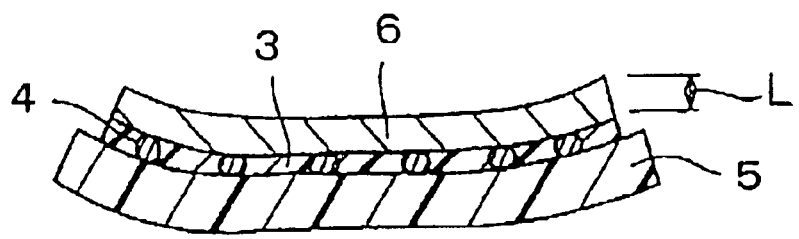
FIG. 13 is a cross-sectional view showing a state in which bowing of a wafer with a resin layer is determined.

The bowing was determined for each of the resulting semiconductors by measuring an extent of bowing L using a microdepth meter shown in FIG. 13. In FIG. 13, 5 is an insulating substrate, 4 is connecting electrodes, 6 is a semiconductor element, and 3 is a cured resin layer (cured product of an epoxy resin composition).

TABLE 11

| | Example No. | | | | | |
|---|---|---|---|---|---|---|
| | C1 | C2 | C3 | C4 | C5 | C6 |
| Bowing L (µm) | 30 | 50 | 50 | 40 | 40 | 30 |

TABLE 12

| | Comparative Example No. | | | |
|---|---|---|---|---|
| | C1 | C2 | C3 | C4 |
| Bowing L (µm) | 110 | 150 | 100 | 100 |

As is clear from Tables 11 and 12, it can be seen that the products of Examples have very small values of bowing as compared with those of Comparative Examples, so that a semiconductor device having high reliability can be obtained.

Equivalents

The present invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A tablet comprising an epoxy resin composition, said epoxy resin composition comprising a curing agent and an epoxy resin represented by the general formula (1):

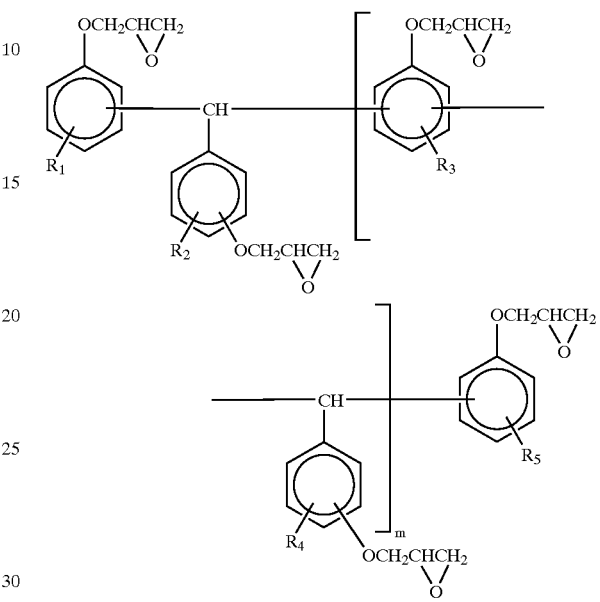

wherein each of $R_1$ to $R_5$ is a hydrogen atom and m is 0 or a positive number of 5 or less, wherein said tablet is produced by a process comprising preparing a molten product of said epoxy resin composition in an uncured state and thereafter cooling and solidifying the molten product, and wherein the amount of the tablet that is reduced by heating is less than 0.05% by weight.

2. The tablet according to claim 1, wherein a compression ratio of the tablet is 98% or more and/or the glass transition temperature of a cured product of the tablet is 120° C. or more.

* * * * *